US012066482B2

(12) United States Patent
Hagiwara (10) Patent No.: US 12,066,482 B2
(45) Date of Patent: Aug. 20, 2024

(54) SOCKET FOR ELECTRICAL COMPONENT

(71) Applicant: ENPLAS CORPORATION, Kawaguchi (JP)

(72) Inventor: Yoshinobu Hagiwara, Kawaguchi (JP)

(73) Assignee: ENPLAS CORPORATION, Saitama (JP)

( * ) Notice: Subject to any disclaimer, the term of this patent is extended or adjusted under 35 U.S.C. 154(b) by 409 days.

(21) Appl. No.: 17/603,198

(22) PCT Filed: Apr. 2, 2020

(86) PCT No.: PCT/JP2020/015236
§ 371 (c)(1),
(2) Date: Oct. 12, 2021

(87) PCT Pub. No.: WO2020/209182
PCT Pub. Date: Oct. 15, 2020

(65) Prior Publication Data
US 2022/0187359 A1 Jun. 16, 2022

(30) Foreign Application Priority Data

Apr. 12, 2019 (JP) ................................. 2019-076386

(51) Int. Cl.
*G01R 31/28* (2006.01)
*G01R 1/04* (2006.01)
(Continued)

(52) U.S. Cl.
CPC ....... *G01R 31/2863* (2013.01); *G01R 1/0466* (2013.01); *G01R 31/2896* (2013.01); *H01R 33/76* (2013.01); *H01R 33/97* (2013.01)

(58) Field of Classification Search
CPC .............. G01R 31/2863; G01R 1/0466; G01R 31/2896; H01R 33/97; H01R 33/945; H01R 13/193; H01R 33/76
See application file for complete search history.

(56) References Cited

U.S. PATENT DOCUMENTS 7,568,918 B2 * 8/2009 Uratsuji ............... G01R 1/0466
439/73
7,887,355 B2 * 2/2011 Watanabe ............ H05K 7/1061
439/73
(Continued)

FOREIGN PATENT DOCUMENTS

JP 11-162602 6/1999
JP 11-329643 11/1999
(Continued)

OTHER PUBLICATIONS

International Search Report PCT/ISA/210, issued on Jun. 16, 2020 in corresponding International Application PCT/JP2020/015236.
(Continued)

*Primary Examiner* — Renee S Luebke
*Assistant Examiner* — Paul D Baillargeon
(74) *Attorney, Agent, or Firm* — STAAS & HALSEY LLP (57) ABSTRACT

A socket for an electrical component including a socket main body 11 including a contact pin, an operating member 12 provided in the socket main body 11 in a vertically movable manner and urged upward, an opening/closing body 14 provided in the socket main body 11 as being capable of being opened and closed and configured to press an electrical component arranged in the socket main body 11 by being closed, an opening/closing link mechanism 15 connected to the opening/closing body 14 with a base end part 15a thereof connected to the socket main body 11 and the operating member 12 to close the opening/closing body 14 when being lifted by the operating member 14, and a depression mechanism 16 which depresses a leading end part 15b of the opening/closing link mechanism 15 when the opening/closing body 14 is closed.

2 Claims, 12 Drawing Sheets

(51) Int. Cl.
*H01R 33/76* (2006.01)
*H01R 33/97* (2006.01)

(56) References Cited

U.S. PATENT DOCUMENTS 9,807,909 B1 * 10/2017 Kobayashi .............. H01L 23/34
2017/0176493 A1    6/2017 Iy

FOREIGN PATENT DOCUMENTS

| JP | 2004-14873 | 1/2004 |
| JP | 2005-327628 | 11/2005 |
| JP | 2009-87739 | 4/2009 |
| JP | 2015-50190 | 3/2015 |
| JP | 2019-32930 | 2/2019 |

OTHER PUBLICATIONS

Written Opinion of the International Searching Authority, PCT/ISA/237 issued on Jun. 16, 2020 in corresponding International Patent Application PCT/JP2020/015236.

* cited by examiner

SOCKET FOR ELECTRICAL COMPONENT

CROSS-REFERENCE TO RELATED APPLICATIONS

This application is a U.S. National Stage Application which claims the benefit under 35 U.S.C. § 371 of International Patent Application No. PCT/JP2020/015236 filed on Apr. 2, 2020, which claims foreign priority benefit under 35 U.S.C. 119 of Japanese Patent Application No. 2019-076386 filed on Apr. 12, 2019, in Japanese Intellectual Property Office, the contents of all of which are incorporated herein by reference.

FIELD

The present invention relates to a socket for an electrical component which is electrically connected to an electrical component such as a semiconductor device (hereinafter referred to as an "IC package").

BACKGROUND

Conventionally, an IC socket and the like in which contact pins are arranged is known as a socket for an electrical component. The IC socket is configured to accommodate an IC package arranged on a wiring board as an inspection object, electrically connect terminals of the IC package and electrodes of the wiring board via the contact pins, and perform a test such as a continuity test.

As such an IC socket, there is known a so-called open-top type in which a socket main body is opened on the upper side and an IC package is taken in and out through the above. In such an IC socket, an IC package arranged on the socket main body is pressed against an elastic force of the contact pins, and terminals of the IC package and the contact pins are elastically brought into contact with each other.

In such an IC socket, an opening/closing body for pressing the IC package arranged on the socket main body is provided in the socket main body as being capable of being opened and closed, and the opening/closing body is rotated via a link mechanism to press the IC package by vertically moving an operating member mounted on the socket main body.

For example, in Patent Document 1, a link mechanism is configured of a latch and a lever, and when a cover which is an operating member is lifted, the latch and the lever rotate to lower a latch plate, thereby pressing the IC package.

LIST OF DOCUMENTS

Patent Documents

Patent Document 1: Japanese Patent Application Publication No. 2015-50190

SUMMARY

Technical Problem

However, in the conventional socket for an electrical component, base end parts at both ends of the link mechanism is connected to the socket main body and the operating member, and the opening/closing body is pressed at a position lateral to the both base end parts. Therefore, when a large reaction force acts on the opening/closing body, such as when the IC package is brought into pressure contact with a large number of contact pins, deflection or displacement occurs at a leading end part side of the link mechanism, and operation of the link mechanism tends to become incomplete.

As a result, when a large reaction force acts on the opening/closing body, pressing force pressing an electrical component is biased or insufficient, and the electrical component cannot be uniformly pressed with a sufficient pressing force.

Therefore, an object of the present invention is to provide a socket for an electrical component capable of pressing an entire electrical component more uniformly with a sufficient pressing force by an opening/closing body.

Solution to Problem

To solve the problem described above, a socket for an electrical component of the present invention includes a socket main body including a contact pin, an operating member provided in the socket main body in a vertically movable manner and urged upward, an opening/closing body provided in the socket main body as being capable of being opened and closed and configured to press an electrical component arranged in the socket main body by being closed, an opening/closing link mechanism connected to the opening/closing body with a base end part thereof connected to the socket main body and the operating member to close the opening/closing body when being lifted by the operating member, and a depression mechanism which depresses a leading end part of the opening/closing link mechanism when the opening/closing body is closed.

The depression mechanism of the socket for an electrical component of the present invention includes a depression member which opens the opening/closing link mechanism when the opening/closing body is opened and which is engaged with and depresses the leading end part of the opening/closing link mechanism when the opening/closing body is closed.

The depression mechanism of the socket for an electrical component of the present invention includes a swing lever which is supported by the socket main body in a swingable manner, connected to the operating member at a base end part of the swing lever, and engaged with the depression member at a leading end part of the swing lever, and the leading end part of the swing lever depresses the depression member when the operating member is lifted.

Effect of the Invention

According to the socket for an electrical component of the present invention, an opening/closing body which is closed when an operating member is lifted is connected to an opening/closing link mechanism whose base end part is connected to the operating member urged upward and a socket main body, and a leading end part of the opening/closing link mechanism is depressed by a depression member when the opening/closing body is closed.

Accordingly, when the opening/closing body is closed, the opening/closing link mechanism can be operated in a state in which the base end part and the leading end part of the opening/closing link mechanism are stably supported, and it is possible to prevent deflection and displacement at the leading end part of the opening/closing link mechanism even when a large reaction force acts by pressing the opening/closing body at a position lateral to the base end part.

As a result, it is possible to provide the socket for an electrical component in which a predetermined operation of the opening/closing body can be reliably realized by the opening/closing link mechanism, and the entire electrical component can be uniformly pressed with a sufficient pressing force by the opening/closing body.

Advantageous Effects

According to the socket for an electrical component of the present invention, for example, being provided with the depression member which opens the opening/closing link mechanism when the opening/closing body is opened and which is engaged with and depresses the leading end part of the opening/closing mechanism when the opening/closing body is closed, the depression member can be arranged operable only in a range in which a large reaction force from the opening/closing body acts on the opening/closing link mechanism, so that the operating range of the depression mechanism can be reduced compared to that of the opening/closing link mechanism and the configuration can be simplified.

According to the socket for an electrical component of the present invention, for example, being provided with the swing lever which is supported by the socket main body in a swingable manner, connected to the operating member at a base end part of the swing lever, and engaged with the depression member at a leading end part of the swing lever and being configured that the leading end part of the swing lever depresses the depression member when the operating member is lifted, the depression member can be reliably depressed when the operating member is lifted, so that reliable operation can be realized with a simple configuration.

BRIEF DESCRIPTION OF DRAWINGS

FIGS. 6A to 6D are views for explaining operation of an opening/closing link mechanism of the IC socket according to the embodiment of the present invention, where

FIGS. 7A and 7B are schematic diagrams for explaining the operation of the opening/closing link mechanism of the IC socket according to the embodiment of the present invention, where

FIGS. 9A to 9D are views for explaining operation in which the opening/closing link mechanism and the depression mechanism of the IC socket according to the embodiment of the present invention are combined, where

FIGS. 10A and 10B are schematic diagrams for explaining the operation in which the opening/closing link mechanism and the depression mechanism of the IC socket according to the embodiment of the present invention are combined, where

DETAILED DESCRIPTION

Hereinafter, an embodiment of the present invention will be described with reference to the drawings.

An IC socket 10 as a "socket for an electrical component" of the present embodiment is arranged on a wiring board and is used as a test device and the like for a continuity test such as a burn-in test for an IC package.

As shown in FIGS. 1 to 5, the IC socket 10 includes a socket main body 11 capable of accommodating an IC package as an "electrical component", an operating member 12 provided in the socket main body 11 in a vertically-movable manner, an urging means 13 for urging the operating member 12 upward, an opening/closing body 14 provided at the socket main body 11 capable of being opened and closed, an opening/closing link mechanism 15 connected to the opening/closing body 14 with a base end part 15a thereof at each side connected to the socket main body 11 and the operating member 12, and a depression mechanism 16 which depresses a leading end part 15b of the opening/closing link mechanism 15.

The socket main body 11 includes a base portion 17 made of metal and a plurality of rising pieces 18 erected on the outer peripheral side of the base portion 17. In the socket main body 11, a contact pin unit allowing an IC package to be placed on the upper surface side thereof is provided as being surrounded by the base portion 17, and a large number of contact pins connected to a wiring board are arranged at positions corresponding to terminals of the IC package, but detailed illustration thereof is omitted.

The operating member 12 is formed in a frame shape surrounding the outer periphery of the socket main body 11 and is arranged along the plurality of rising pieces 18 in a vertically movable manner.

Figure 1:
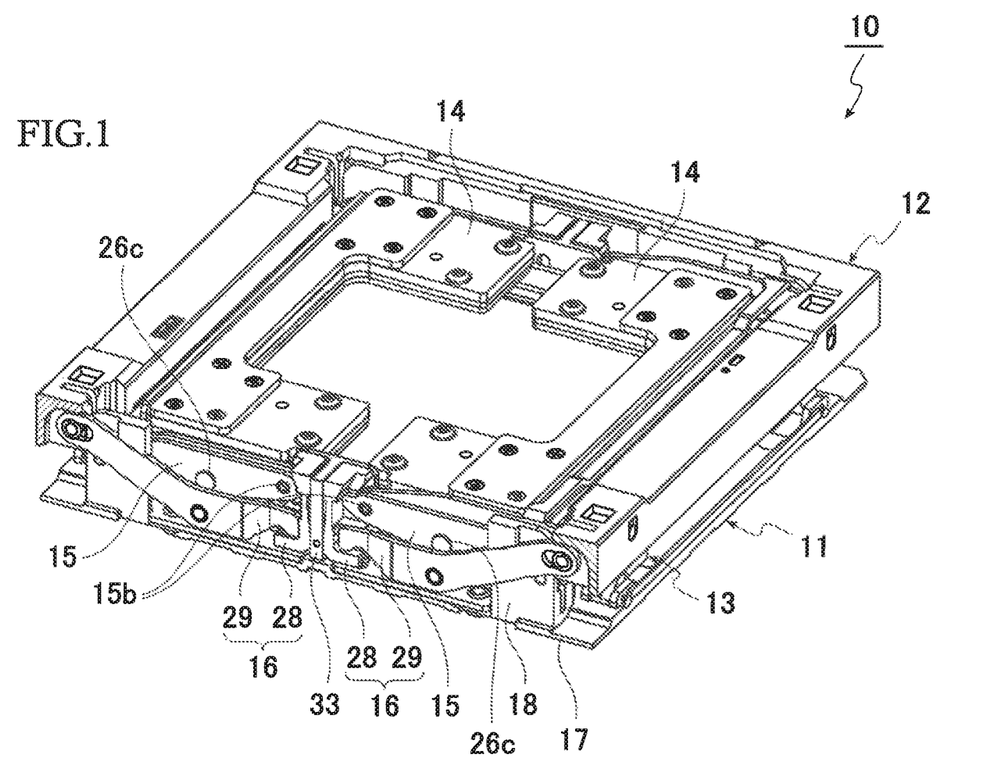
FIG. 1 is a perspective view of an IC socket according to an embodiment of the present invention, showing a state in which an opening/closing body is closed with a front side of an operating member omitted.
Figure 2:
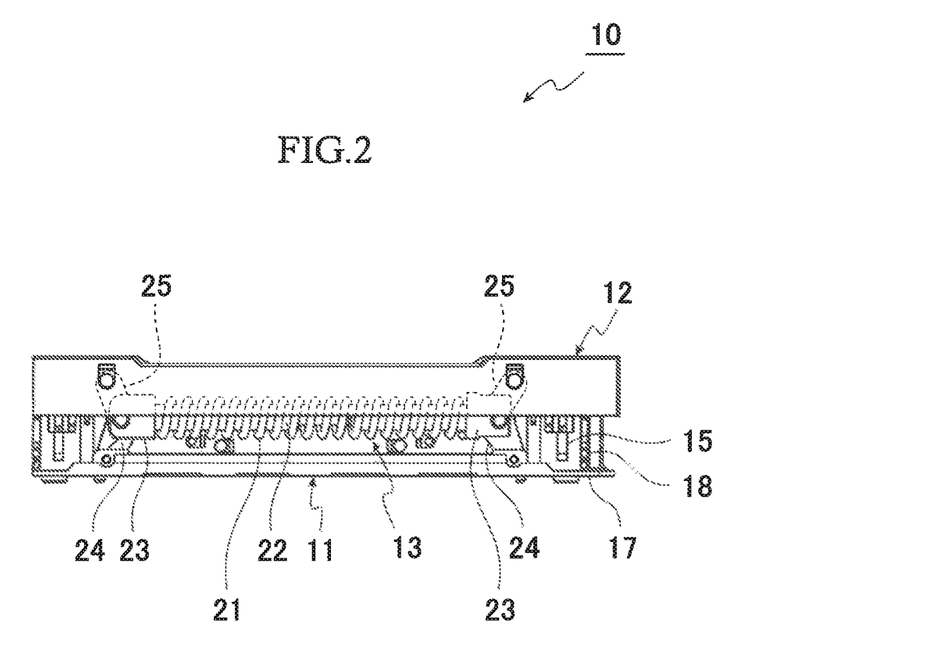
FIG. 2 is a side view of the IC socket according to the embodiment of the present invention, showing a state in which the opening/closing body is closed.
Figure 3:
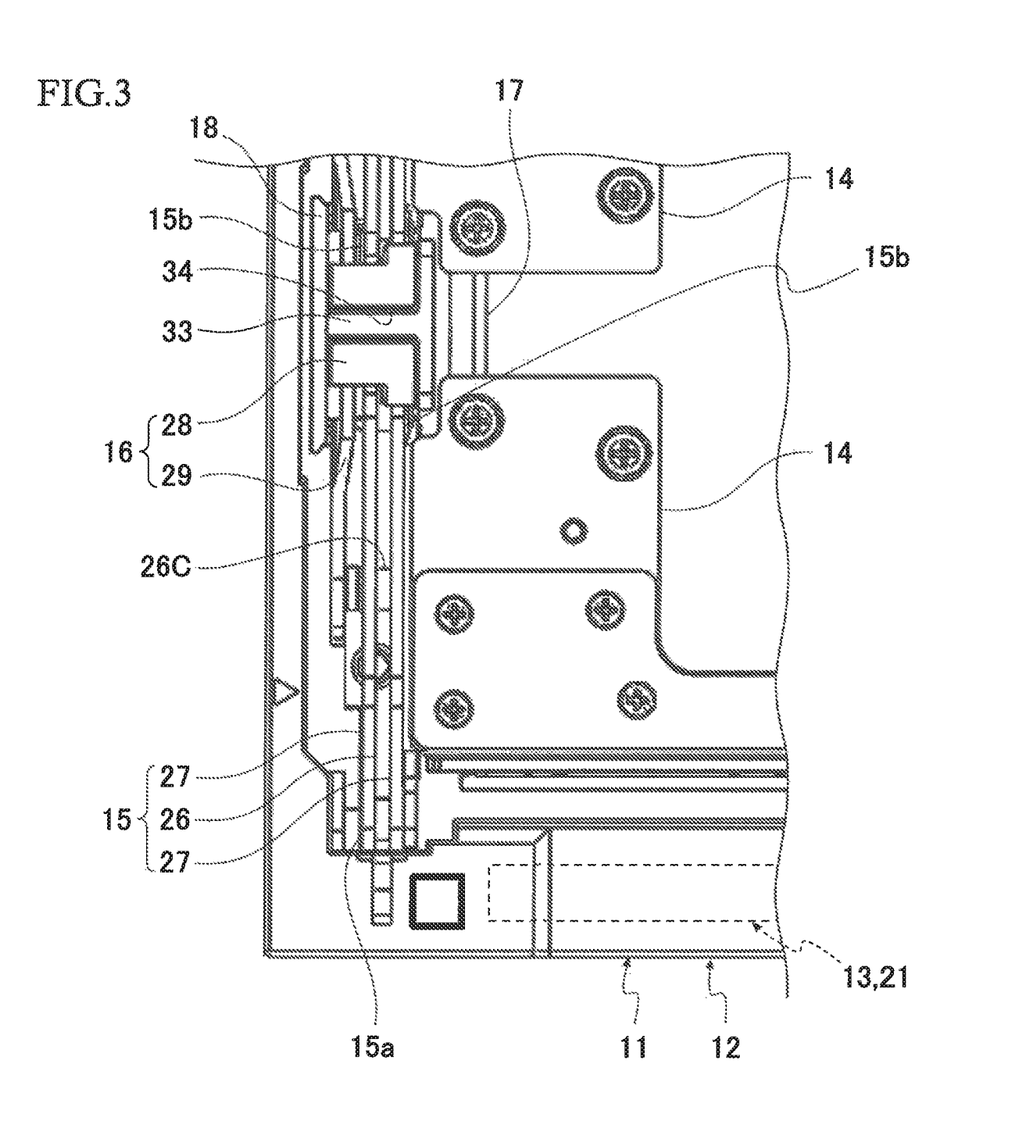
FIG. 3 is an enlarged partial view of the IC socket according to the embodiment of the present invention, showing a state in which the opening/closing body is closed.

As shown in FIG. 2, the urging means 13 includes a compression spring 21 and a spring holding portion 22 arranged along a side edge of the socket main body 11, a pair of end blocks 23 urged in a direction separating from each other by the compression spring 21 provided at both ends of the spring holding portion 22, a first urging lever 24 having one end pivotally supported in a rotatable manner by the base portion 17 of the socket main body 11 and the other end pivotally supported in a rotatable manner by the corresponding end block 23, and a second urging lever 25 having one end pivotally supported in a rotatable manner by the operating member 12 and the other end pivotally supported in a rotatable manner by the corresponding end block 23.

In the urging means 13, the end blocks 23 at both ends are urged in a separating direction by the compression spring 21, so that the one end of the first urging lever 24 and the one end of the second urging lever 25 are urged in a separating direction, thereby the socket main body 11 is urged upward with respect to the operating member 12. When the operating member 12 is pressed downward and is lowered, the one end of the first urging lever 24 and the one end of the second urging lever 25 are displaced in a direction to be close to each other against the urging force.

The opening/closing body 14 is formed of a piece having a substantially U-shape in plan view, and is pivotally supported by the plurality of rising pieces 18 of the base portion 17 in an openable and closable manner as rotating with respect thereto. In the present embodiment, a pair of the opening/closing bodies 14 are mounted on the side edges of the socket main body 11 at the upper surface side opposed to each other so as to open and close in a double-door opening direction.

The pair of opening/closing bodies 14 are configured to be capable, by being closed, of pressing downward the outer periphery of the unillustrated IC package arranged on the socket main body 11. Terminals of the IC package are brought into pressure contact with a large number of unillustrated contact pins provided on the socket main body 11 by pressing the IC package downward. Since the large number of terminals of the IC package are brought into pressure contact against an elastic force of the large number of contact pins, a large reaction force acts on the opening/closing body 14 from the IC package when the opening/closing body 14 is closed.

As shown in FIGS. 6A to 6D and FIGS. 7A, 7B, the opening/closing link mechanism 15 includes a first opening/closing lever 26 whose base end part 26a is pivotally supported by the base portion 17 of the socket main body 11, and a second opening/closing lever 27 whose base end part 27a is pivotally supported in a rotatable manner by the operating member 12. A leading end part 26b of the first opening/closing lever 26 and a leading end part 27b of the second opening/closing lever 27 are connected to each other in a relatively rotatable manner.

In the opening/closing link mechanism 15, the base end part 15a at each side of the opening/closing link mechanism 15 is configured by connecting the base end parts 26a, 27a of the first and second opening/closing levers 26, 27 to the socket main body 11 and the operating member 12, and the leading end part 15b is configured by a joint portion to which the first opening/closing lever 26 and the second opening/closing lever 27 are connected and the vicinity thereof.

An opening/closing body connecting portion 26c is provided at an intermediate position in the longitudinal direction of the first opening/closing lever 26 of the opening/closing link mechanism 15, and the first opening/closing lever 26 and the opening/closing link mechanism 15 are connected to the opening/closing body 14 in a relatively rotatable manner. The opening/closing body connecting portion 26c is spaced apart from a pivotally supporting part of the opening/closing body 14 for the socket main body 11, and is provided at a position lateral to the base end part 15a at each side of the opening/closing link mechanism 15 in a state in which the opening/closing body 14 is closed.

Therefore, the opening/closing body 14 can be opened and closed by the leading end part 15b side of the opening/closing link mechanism 15 rotating with respect to the base end part 15a side owing to the lifting and lowering of the operating member 12.

In the opening/closing link mechanism 15, the base end part 26a of the first opening/closing lever 26 connected to the socket main body 11 and the base end part 27a of the second opening/closing lever 27 connected to the operating member 12 are both provided at a position lower than the connecting portion between the first opening/closing lever 26 and the second opening/closing lever 27, and the base end part 27a is provided at a position above the base end part 26a. Further, the distance from the connecting portion between the first opening/closing lever 26 and the second opening/closing lever 27 is longer for the base end part 27a than for the base end part 26a.

Thus, as shown in FIGS. 1, 6A, 6B, and 7A, in a state in which the operating member 12 is at the highest position, the leading end part 15b and the opening/closing body connecting portion 26c are located at the lowest position in the opening/closing link mechanism 15 and the opening/closing body 14 is arranged in a completely closed state with respect to the socket main body 11.

Figure 6A:
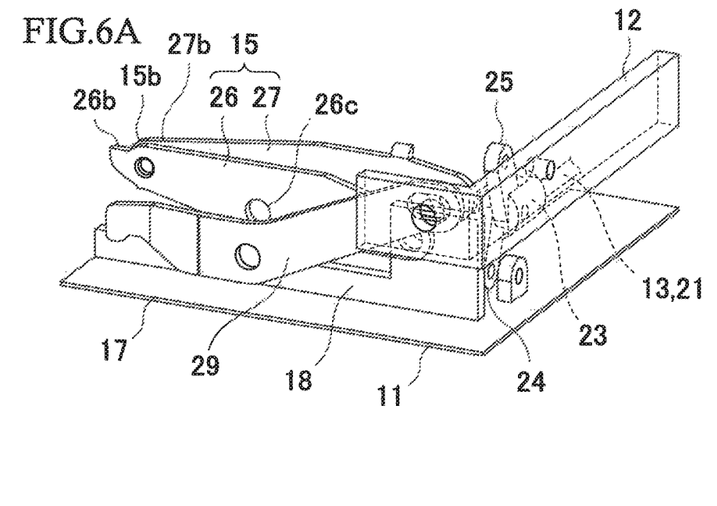
FIG. 6A is a partial perspective view showing the state in which the opening/closing body is closed.
Figure 6B:
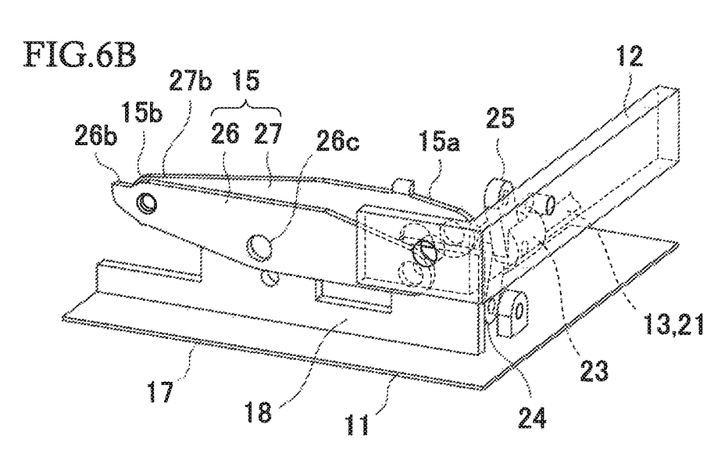
FIG. 6B is a partial perspective view showing the state in which the opening/closing body is closed with a swing lever omitted.
Figure 6C:
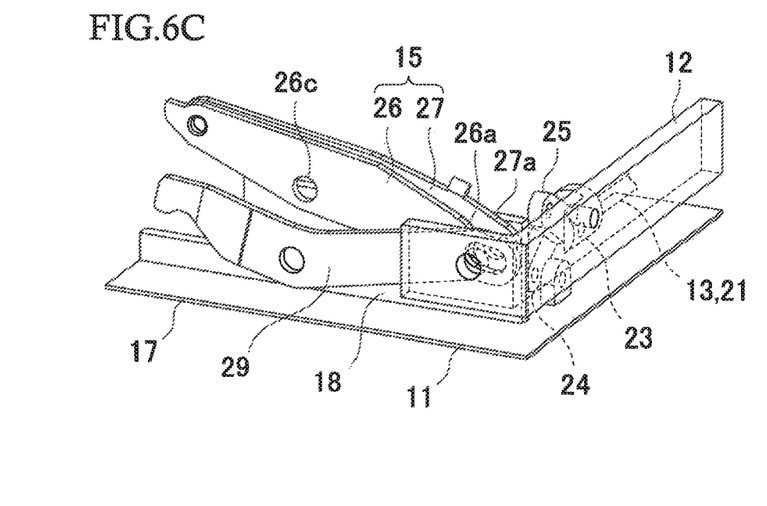
FIG. 6C is a partial perspective view showing a state in which the opening/closing body is in the midpoint of being closed.
Figure 6D:
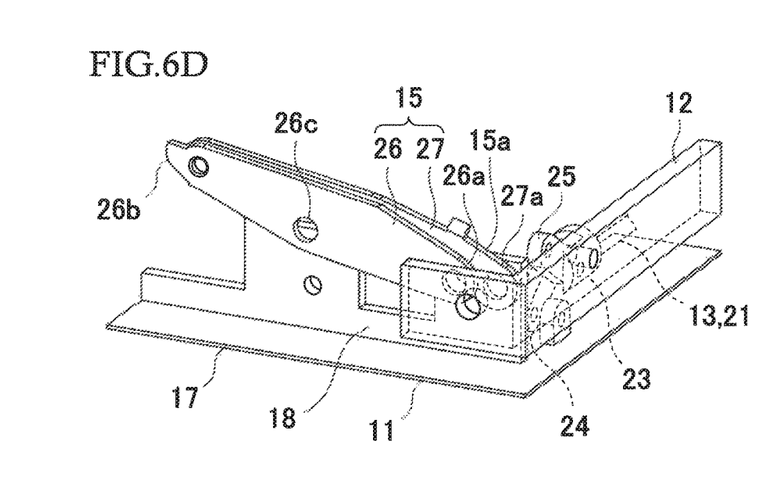
FIG. 6D is a partial perspective view showing the state in which the opening/closing body is in the midpoint of being closed with the swing lever omitted.
Figure 7A:
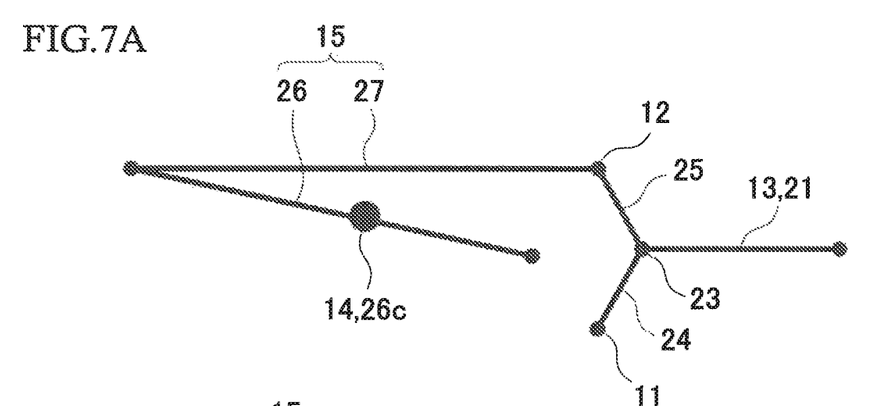
FIG. 7A is a diagram showing the state in which the opening/closing body is closed.
Figure 7B:
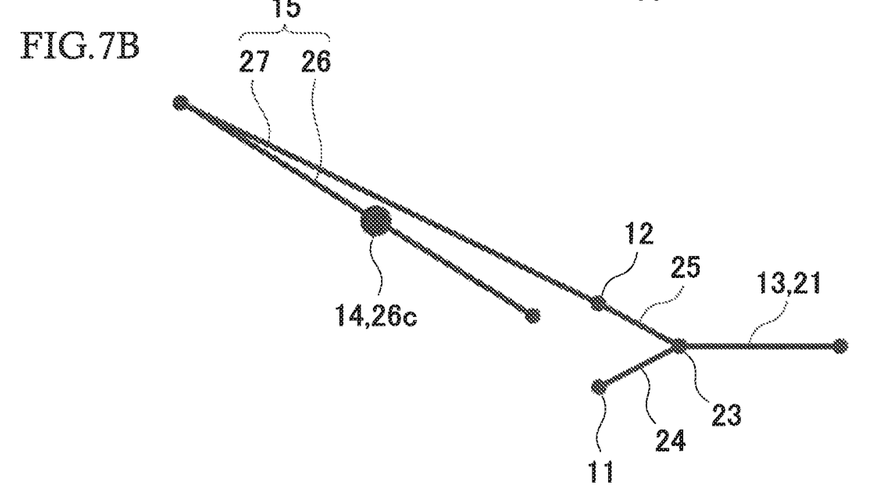
FIG. 7B is a diagram showing the state in which the opening/closing body is in the midpoint of being closed.
Figure 8A:
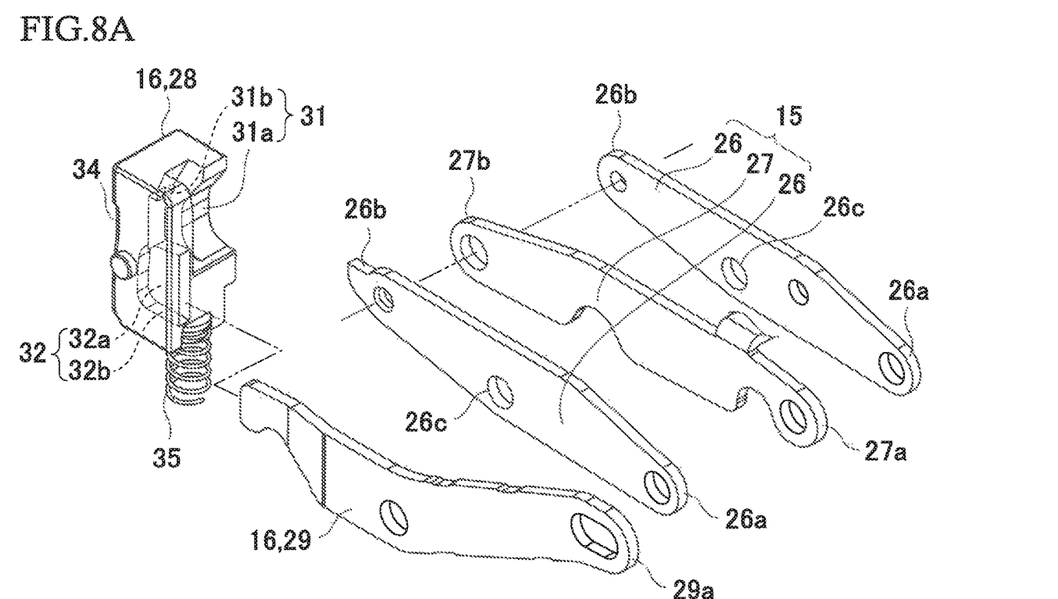
FIG. 8A is an exploded perspective view showing a depression mechanism of the IC socket according to the embodiment of the present invention.
Figure 8B:
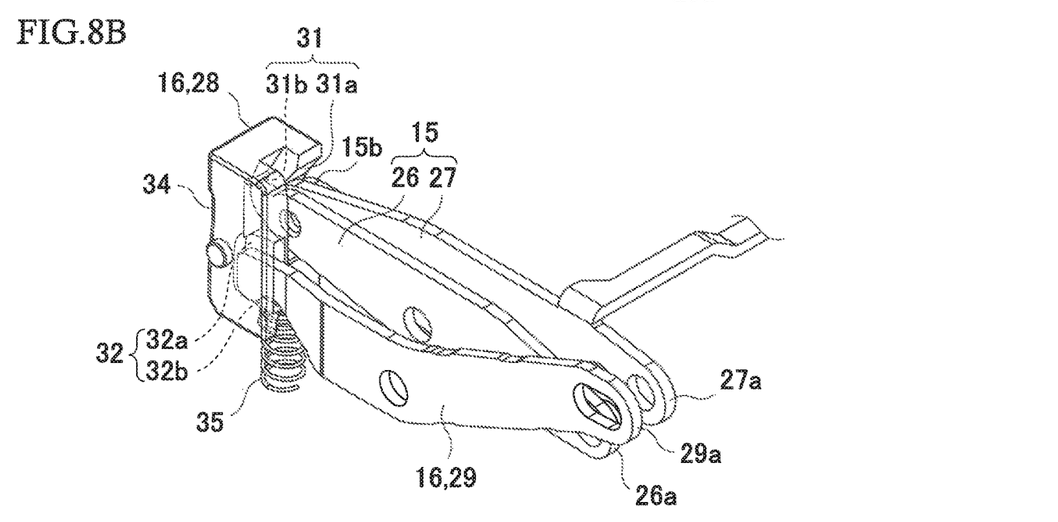
FIG. 8B is a perspective view of the depression mechanism in an assembled state.

As shown in FIGS. 6C, 6D, and 7B, when the operating member 12 is lowered against the urging force of the urging means 13, the leading end part 15b and the opening/closing body connecting portion 26c are lifted in the opening/closing link mechanism 15, and the opening/closing body 14 starts to be opened.

Figure 4:
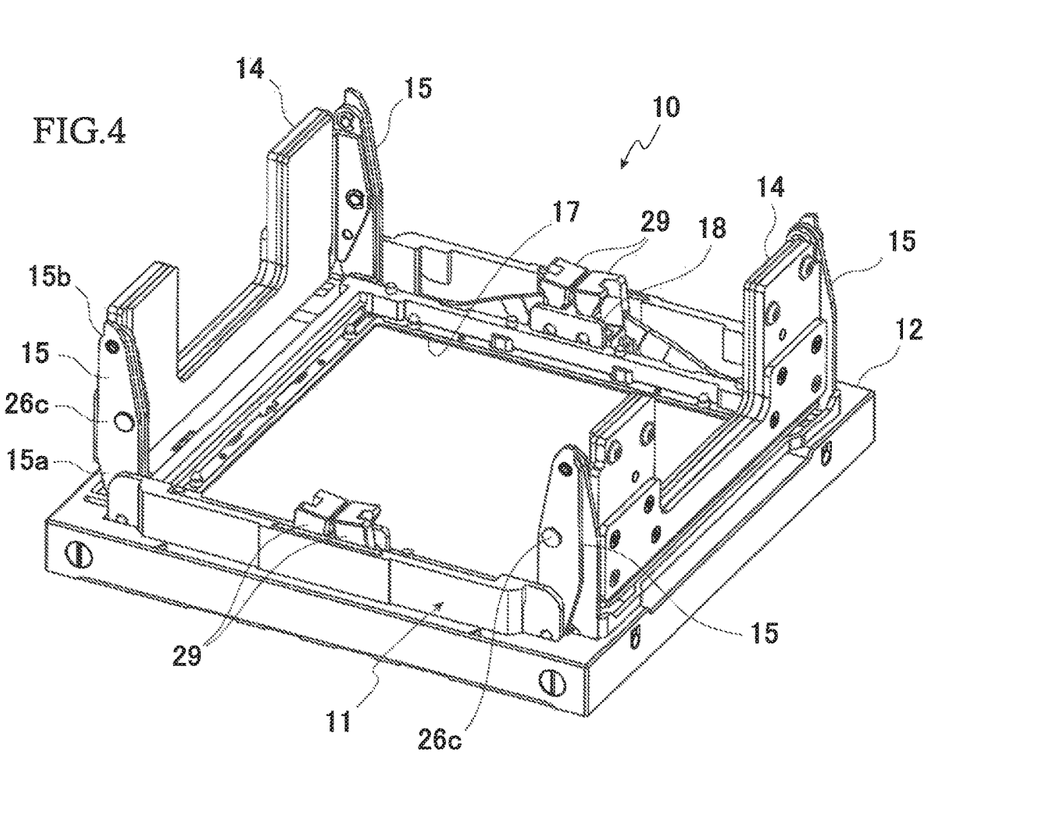
FIG. 4 is a perspective view of the IC socket according to the embodiment of the present invention, showing a state in which the opening/closing body is opened.
Figure 5:
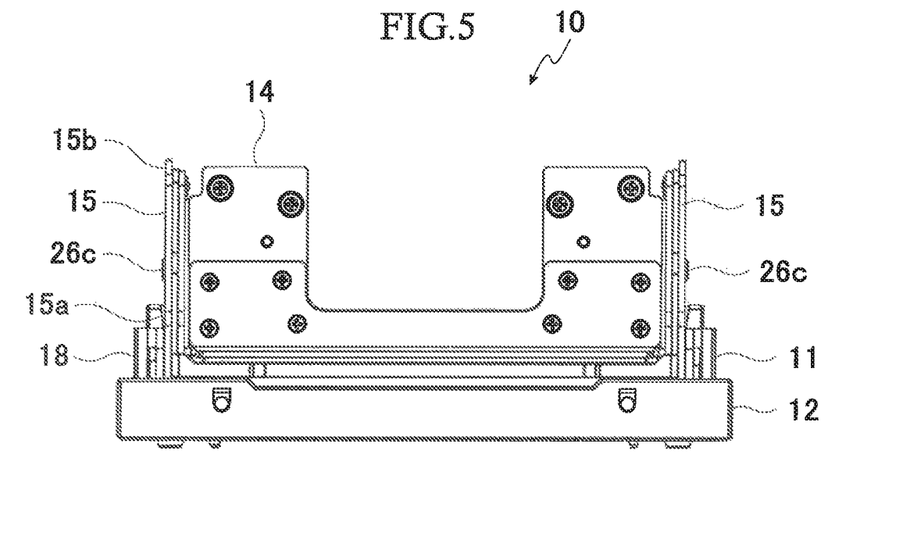
FIG. 5 is a side view of the IC socket according to the embodiment of the present invention, showing a state in which the opening/closing body is opened.

Then, when the operating member 12 reaches the lowest position, as shown in FIGS. 4 and 5, the leading end part 15b and the opening/closing body connecting portion 26c are located at the highest position in the opening/closing link mechanism 15 and the opening/closing body 14 is arranged in a completely opened state with respect to the socket main body 11.

As shown in FIGS. 1, 8A, 8B, 9A to 9D, 10A, and 10B, the depression mechanism 16 is configured to depress the leading end part 15b of the opening/closing link mechanism 15 when the opening/closing body 14 is to be closed. The depression mechanism 16 of the present embodiment includes a depression member 28 which opens the opening/closing link mechanism 15 when the opening/closing body 14 is opened and which is engaged with the leading end part 15b of the opening/closing link mechanism 15 when the opening/closing body 14 is closed, and a swing lever 29 which is supported by the socket main body 11 in a swingable manner, connected to the operating member 12 at a base end part 29a, and engaged with the depression member 28 at a leading end part 29b.

The depression member 28 is arranged, on the side edge of the socket main body 11 where the opening/closing link mechanism 15 is arranged, at the position corresponding to the leading end part 15b of the opening/closing link mechanism 15, and is supported by the rising piece 18 of the socket main body 11 in a vertically movable manner.

Each depression member 28 includes, at one side surface facing the opening/closing link mechanism 15, an opening/closing link engaging portion 31 detachably engageable with the leading end part 26b of the first opening/closing lever 26 of the opening/closing link mechanism 15, and a swing lever engaging portion 32 formed along the opening/closing link engaging portion 31 and continuously accommodating the leading end part 29b of the swing lever 29. The opening/closing link engaging portion 31 and the swing lever engaging portion 32 are urged upward by a push-up spring 35 interposed at a space with respect to the socket main body 11.

The opening/closing link engaging portion 31 includes an engaging opening 31a through which the leading end part 15b of the rotating opening/closing link mechanism 15 is inserted and detached, and an engaging step steeply provided so as to be engaged with the leading end part 15b of the opening/closing link mechanism 15 from the above.

The swing lever engaging portion 32 includes an accommodating portion 32a in which the leading end part 29b of the swing lever 29 is loosely fitted, and a depression step 32b capable of being depressed by the leading end part 29b of the swing lever 29.

On the other side surface of the depression member 28, there is provided a guide cam 34 which comes into slide contact with a guide protrusion 33 fixedly arranged on the side surface of the rising pieces 18 of the socket main body 11 when the depression member 28 is vertically moved.

The swing lever 29 is arranged in parallel with the first opening/closing lever 26 and the second opening/closing lever 27 of the opening/closing link mechanism 15 and is supported by the socket main body 11 in a swingable manner at an intermediate position in the longitudinal direction. The base end part 29a of the swing lever 29 is rotatably connected to the operating member 12, and the leading end part 29b is accommodated in the swing lever engaging portion 32 of the depression member 28.

In the opening/closing link mechanism 15 of the present embodiment, the depression member 28 urged by the push-up spring 35 is pushed up together with the leading end part 15b of the opening/closing link mechanism 15 when the opening/closing body 14 is opened. At that time, the depression member 28 is pressed rearward (i.e., the side separating from the opening/closing link mechanism 15) while being pushed up by the leading end part 15b of the opening/closing link mechanism 15 and the push-up spring 35, so that the guide cam 34 is in slide contact with the guide protrusion 33.

Figure 11A:
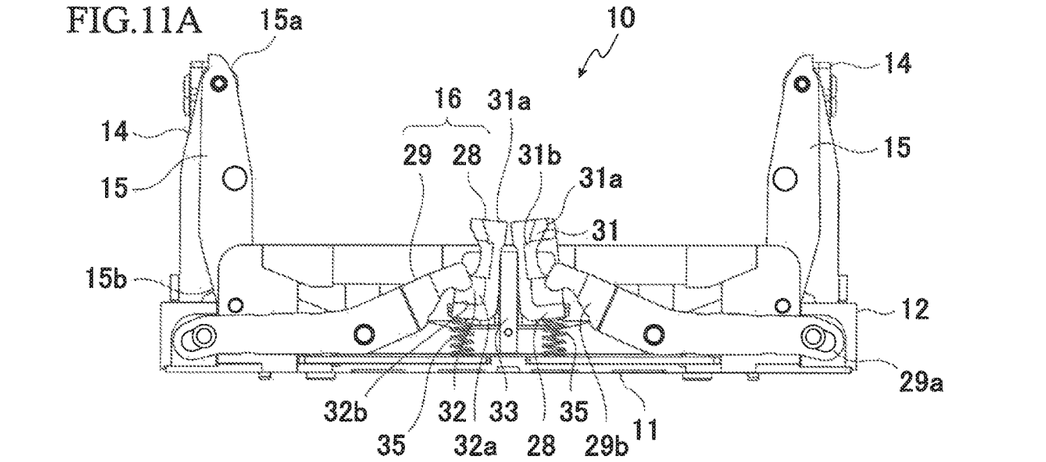
FIGS. 11A, 11B, 11C, and 11D are side views of the IC socket according to the embodiment of the present invention for explaining operation from a state in which the opening/closing body is fully opened to a state in which the opening/closing body is fully closed with the front side of the operating member omitted.
Figure 11B:
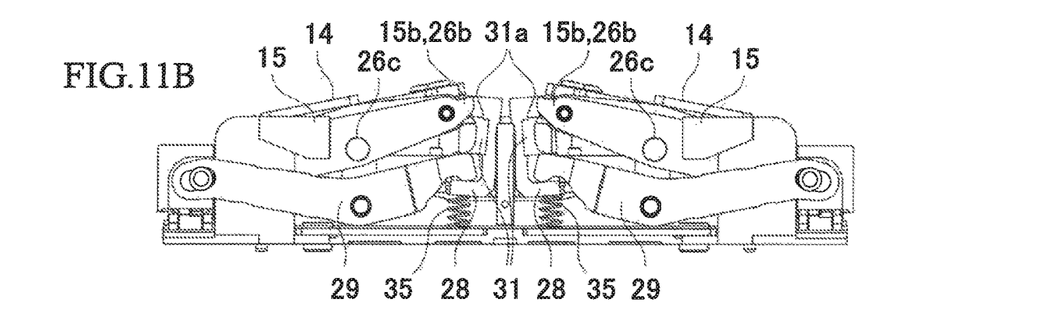
Figure 11C:
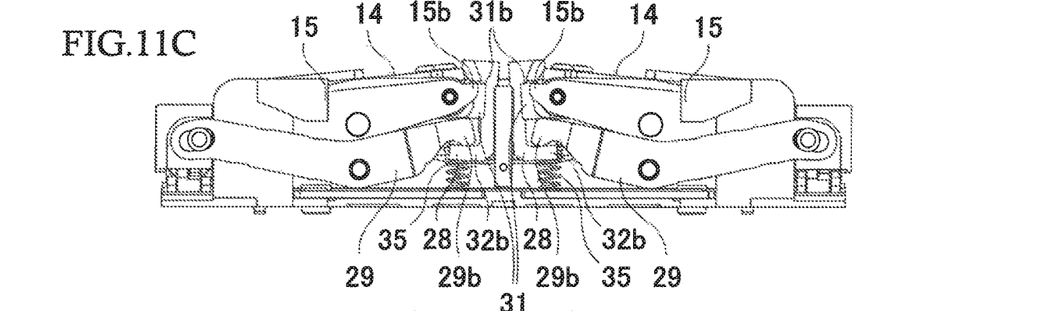
Figure 11D:
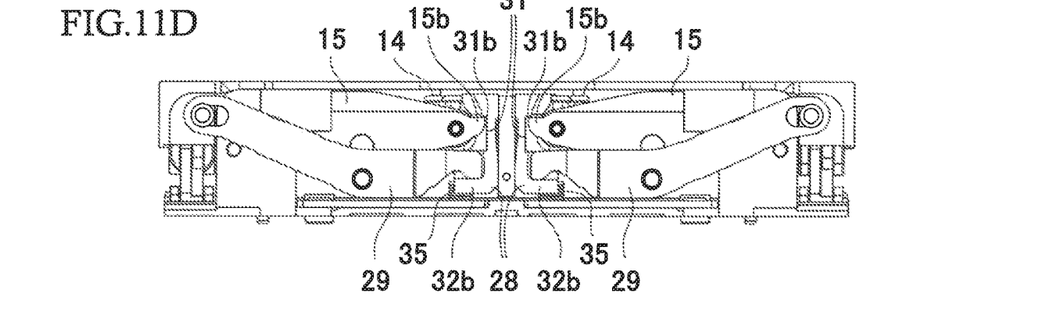

Accordingly, for example, as shown in FIGS. 11B, 11C, and 11D described later, the upper part of the depression member 28 is inclined rearward and the engaging opening 31a can be further opened widely toward the rear side.

On the other hand, when the opening/closing body 14 is closed, after the leading end part 15b of the opening/closing link mechanism 15 is accommodated in the opening/closing link engaging portion 31 through the engaging opening 31a, the depression step 32b is pressed downward by the leading end part 29b of the swing lever 29 accommodated in the swing lever engaging portion 32, so that the depression member 28 is depressed.

At that time, the leading end part 15b of the opening/closing link mechanism 15 presses the guide cam 34 rearward (the side separating from the opening/closing link mechanism 15) while contacting and depressing the bottom parts and the like of the opening/closing link engaging portion 31 from the engaging opening 31a to the engaging step 31b, so that the guide cam 34 slides on the guide protrusion 33.

As a result, as shown in FIGS. 11B, 11C, and 11D described later, the inclination of the upper part of the depression member 28 is returned and the upper part is displaced to the opening/closing link mechanism 15 side, and the leading end part 15b of the opening/closing link mechanism 15 is engaged with the engaging step 31b of the opening/closing link engaging portion 31. When the depression step 32b is further pressed downward by the leading end part 29b of the swing lever 29, the leading end part 15b of the opening/closing link mechanism 15 is depressed by the depression member 28.

In the depression mechanism 16 described above, as shown in FIGS. 1, 9A, 9B, and 10A, in a state in which the operating member 12 is located at the highest position, the opening/closing body 14 is first arranged in a completely closed state with respect to the socket main body 11 by the opening/closing link mechanism 15. In the depression mechanism 16, in a state in which the leading end part 15b of the opening/closing link mechanism 15 is engaged with the engaging step 31b of the opening/closing link engaging portion 31 of the depression member 28, the leading end part 29b of the swing lever 29 depresses the depression step 32b of the swing lever engaging portion 32. In this state, the depression member 28 and the leading end part 15b of the opening/closing link mechanism 15 engaged with the depression member 28 are most depressed.

Figure 9A:
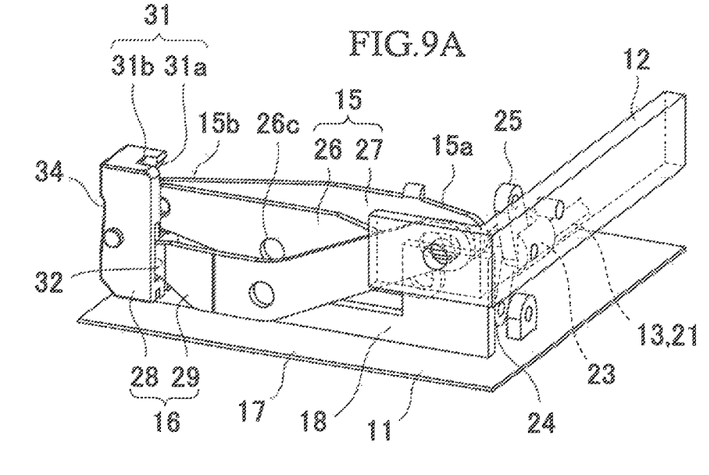
FIG. 9A is a partial perspective view showing the state in which the opening/closing body is closed.
Figure 9B:
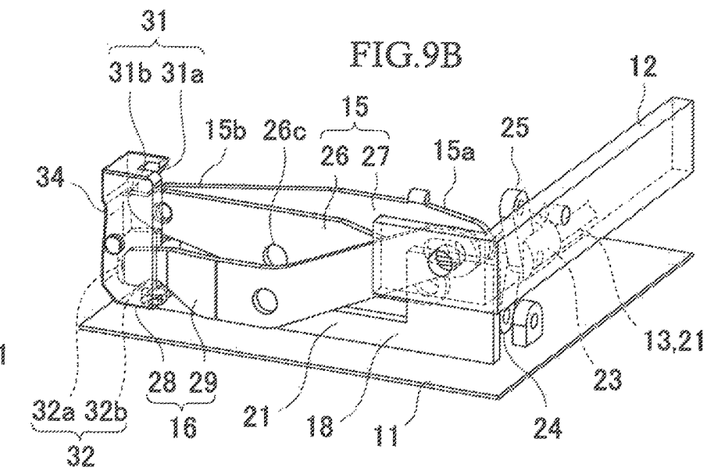
FIG. 9B is a partial perspective view showing the state in which the opening/closing body is closed with a depression member shown transparent.
Figure 9C:
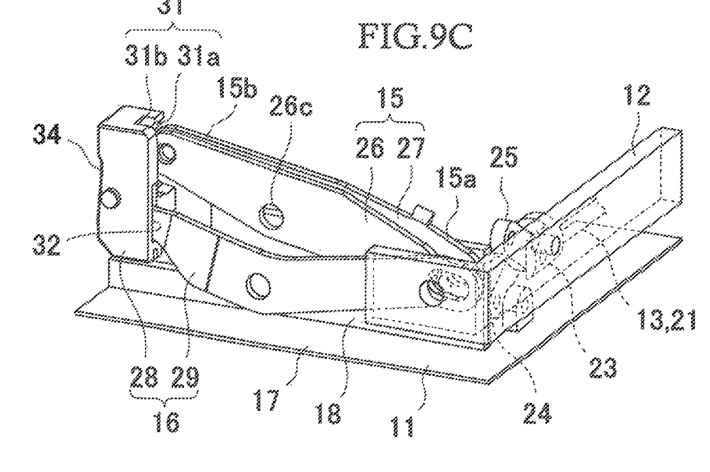
FIG. 9C is a partial perspective view showing the state in which the opening/closing body is in the midpoint of being closed.
Figure 9D:
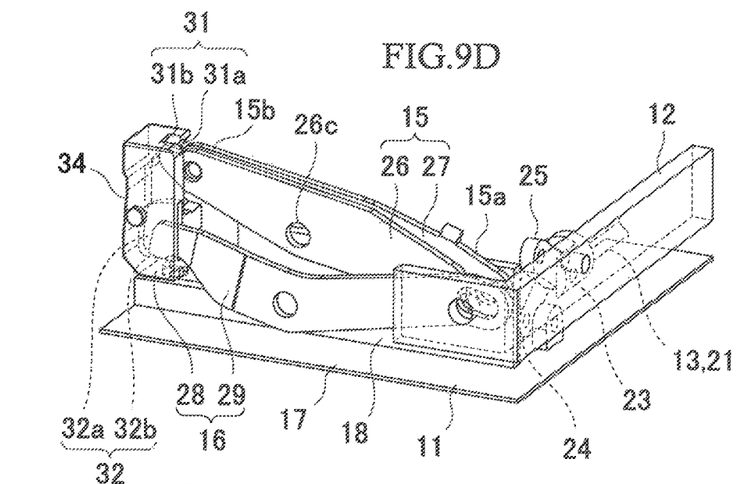
FIG. 9D is a partial perspective view showing the state in which the opening/closing body is in the midpoint of being closed with the depression member shown transparent.
Figure 10A:
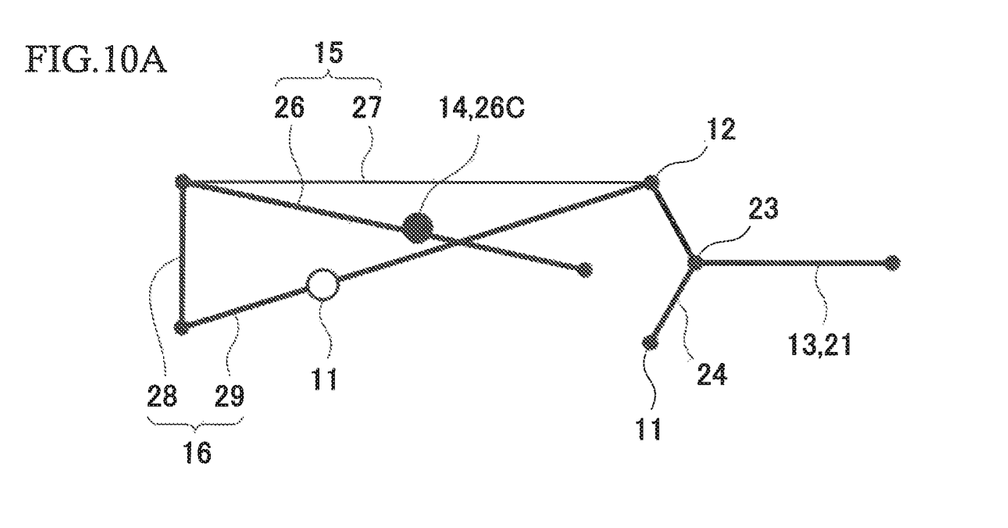
FIG. 10A is a diagram showing the state in which the opening/closing body is in the midpoint of being closed.
Figure 10B:
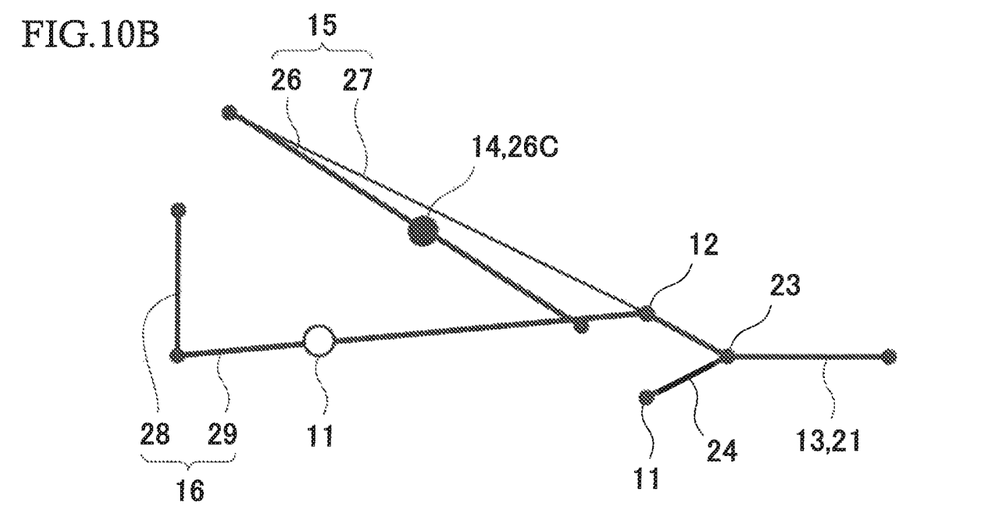
FIG. 10B is a diagram showing the state in which the opening/closing body is closed.

As shown in FIGS. 9C, 9D, and 10B, when the operating member 12 is lowered against the urging force of the urging means 13, the opening/closing body 14 starts to be opened by the opening/closing link mechanism 15, and in the depression mechanism 16, the leading end part 29b of the swing lever 29 which depresses the depression step 32b of the swing lever engaging portion 32 is lifted, and the leading end part 15b of the opening/closing link mechanism 15 is lifted in a state of being engaged with the engaging step 31b of the depression member 28. As a result, the depression member 28 is lifted while causing the guide cam 34 to slide on the guide protrusion 33.

When the depression member 28 is lifted, the leading end part 15b of the opening/closing link mechanism 15 is detached from the engaging step 31b of the depression member 28, and the leading end part 29b of the swing lever 29 is arranged in a state of being loosely fitted in the accommodating portion 32a.

Then, in the state in which the operating member 12 is located at the lowest position, as shown in FIG. 4, the opening/closing body 14 is arranged in a completely opened state with respect to the socket main body 11 by the opening/closing link mechanism 15. In the depression mechanism 16, the depression member 28 is located at the highest position in a state in which the leading end part 15b of the opening/closing link mechanism 15 is detached and the leading end part 29b of the swing lever 29 is loosely fitted in the accommodating portion 32a, and is supported by the socket main body 11 in a state in which the upper part of the depression member 28 is inclined rearward and the engaging opening 31*a* is widely opened upward.

Next, operation of accommodating the IC package into the IC socket 10 of the present embodiment will be described with reference to FIGS. 11A to 11D.

First, as shown in FIG. 11A, the pair of opening/closing bodies 14 are fully opened in the double-door opening direction by lowering the operating member 12 to the lowest position. At this time, in the depression mechanism 16, the depression members 28 are located at the corresponding uppermost positions in a state in which upper parts of the depression members 28 whose back surfaces face each other are inclined rearward so as to be close to each other.

In this state, the operating member 12 is lifted after the IC package is placed on the unillustrated contact pin unit of the socket main body 11. Then, as shown in FIG. 11B, the leading end part 15*b* of the opening/closing link mechanism 15 is inserted into the opening/closing link engaging portion 31 of the depression member 28 through the engaging opening 31*a* and is accommodated in the engaging step 31*b*.

Next, as shown in FIG. 11C, the leading end part 15*b* of the opening/closing link mechanism 15 reaches the vicinity of the engaging step 31*b* of the opening/closing link engaging portion 31 of the depression member 28, and the leading end part 29*b* of the swing lever 29 depresses the depression step 32*b* of the depression member 28, so that the depression member 28 moves downward.

Then, as shown in FIG. 11D, when the leading end part 29*b* of the swing lever 29 depresses the depression member 28, the leading end part 15*b* of the opening/closing link mechanism 15 engaged with the engaging step 31*b* of the opening/closing link engaging portion 31 is strongly depressed by the depression member 28. Thus, the peripheral side of the IC package is strongly pressed by the opening/closing bodies 14, and a large number of terminals of the IC package can be connected to a large number of contact pins against the elastic force thereof.

According to the IC socket 10 of the present embodiment described above, the opening/closing body 14 which is closed when the operating member 12 is lifted is connected to the opening/closing link mechanism 15 whose base end part 15*b* is connected to the operating member 12 urged upward and the socket main body 11, and the leading end part 15*b* of the opening/closing link mechanism 15 is depressed by the depression member 28 when each opening/closing bodies 14 is closed.

Therefore, the base end part 15*a* and the leading end part 15*b* at each side of the opening/closing link mechanism 15 are stably supported when each opening/closing body 14 is closed. That is, the base end part 26*a* of the first opening/closing lever 26 is stably supported by being connected to the socket main body 11 in a rotatable manner, and the base end part 27*a* of the second opening/closing lever 27 is stably supported by being connected to the operating member 12 in a rotatable manner. Further, the leading end part 15*b* to which the first opening/closing lever 26 and the second opening/closing lever 27 are connected in a relatively rotatable manner is stably supported by being engaged with the depression mechanism 16 as being able to be depressed.

Accordingly, the opening/closing link mechanism 15 can be operated in a state in which the base end part 15*a* and the leading end part 15*b* of the opening/closing link mechanism 15 are stably supported, and it is possible to prevent deflection and displacement at the leading end part 15*b* of the opening/closing link mechanism 15 even when a large reaction force acts by pressing the opening/closing body 14 at a position lateral to the base end part 15*a*.

As a result, a predetermined operation of the opening/closing body 14 can be reliably realized by the opening/closing link mechanism 15, and the entire outer periphery of the IC package can be uniformly pressed with a sufficient pressing force by the opening/closing body 14.

Further, according to the IC socket 10 of the present embodiment, the depression mechanism 16 includes the depression member 28 which opens the opening/closing link mechanism 15 when the opening/closing body 14 is opened and which is engaged with the leading end part 15*b* of the opening/closing link mechanism 15 when the opening/closing body 14 is closed. Therefore, the depression member 28 can be arranged operable only in a range in which a large reaction force from the opening/closing body 14 acts on the opening/closing link mechanism 15, so that the operating range of the depression mechanism 16 can be reduced compared to that of the opening/closing link mechanism 15 and the configuration can be simplified.

Figure 12:
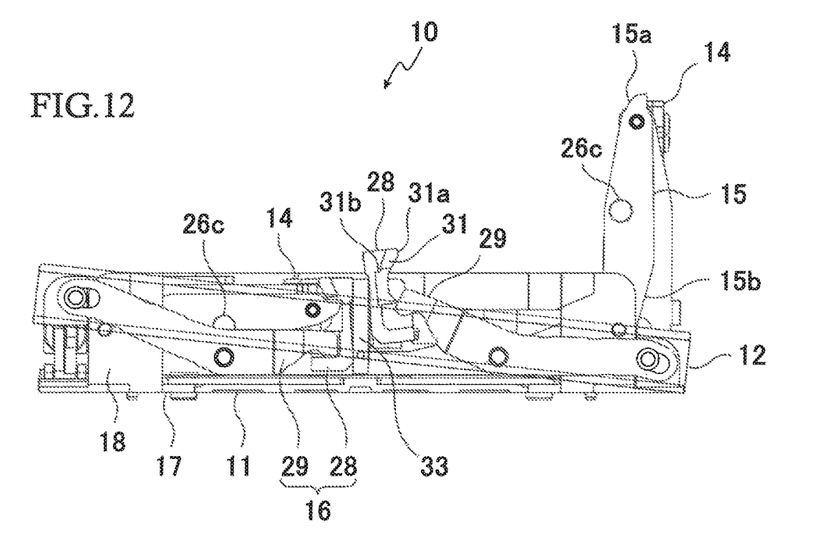
FIG. 12 is a side view of the IC socket according to the embodiment of the present invention for explaining another operation with the front side of the operating member omitted.

Furthermore, the IC socket 10 of the present embodiment may have a configuration in which the pair of opening/closing bodies 14 which open and close in a double-door opening direction by the opening/closing link mechanism 15 are provided, the depression mechanism 16 is provided for the opening/closing link mechanism 15 of each opening/closing body 14, and the engaging opening 31*a* of the opening/closing link engaging portion 31 is inclined upward when the depression member 28 of the depression mechanism 16 is lifted. Then, as shown in FIG. 12, even when the operating member 12 is pressed obliquely by partial contact or the like and one of the opening/closing bodies 14 is closed and the other is opened, when the further depressed side of the inclined operating member 12 is lifted thereafter, the leading end part 15*b* of the opening/closing link mechanism 15 can be smoothly inserted into the opening/closing link engaging portion 31 without abutting to the outer shape part of the depression member 28.

Further, according to the IC socket 10 of the present embodiment, the depression mechanism 16 includes the swing lever 29 which is supported by the socket main body 11 in a swingable manner, connected to the operating member 12 at the base end part 29*a*, and engaged with the depression member 28 at the leading end part 29*b*, and the leading end part 29*b* of the swing lever 29 depresses the depression member 28 when the operating member 12 is lifted. Therefore, the leading end part 29*b* of the swing lever 29 can be lifted when the operating member 12 is lowered, and the leading end part 29*b* of the swing lever 29 can be lowered when the operating member 12 is lifted, so that the depression member 28 can be reliably depressed when the operating member 12 is lifted and reliable operation can be realized with a simple configuration.

Here, the embodiment described above can be appropriately modified within the scope of the present invention.

For example, in the embodiment described above, an example in which the opening/closing body 14 directly presses the periphery of the IC package has been described, but not limited thereto, a heat sink, another pressing member, or the like may be mounted on the opening/closing body 14, and the IC package may be indirectly pressed via the above.

Further, in the embodiment described above, an example in which a pair of the opening/closing bodies 14 are provided to open and close in directions opposite to each other in a double-door opening type has been described. However, the present invention may be applied to a configuration in which one or a plurality of opening/closing bodies 14 are opened and closed in only one side.

Further, the configurations of the opening/closing link mechanism 15 and the depression mechanism 16 of the embodiment described above are merely examples, and it is possible to have other configurations without any limitation.

REFERENCE SIGNS LIST

10 IC socket
11 Socket main body
12 Operating member
13 Urging means
14 Opening/closing body
15 Opening/closing link mechanism
15*a* Base end part
15*b* Leading end part
16 Depression mechanism
17 Base portion
18 Rising piece
21 Compression spring
22 Spring holding portion
23 End block
24 First urging lever
25 Second urging lever
26 First opening/closing lever
26*a* Base end part
26*b* Leading end part
26*c* Opening/closing connecting portion
27 Second opening/closing lever
27*a* Base end part
27*b* Leading end part
28 Depression member
29 Swing lever
29*a* Base end part
29*b* Leading end part
31 Opening/closing link engaging portion
31*a* Engaging opening
31*b* Engaging step
32 Swing lever engaging portion
32*a* Accommodating portion
32*b* Depression step
33 Guide protrusion
34 Guide cam
35 Push-up spring

The invention claimed is:

1. A socket for an electrical component comprising:
a socket main body including a contact pin;
an operating member provided in the socket main body in a vertically movable manner and urged upward;
an opening/closing body provided in the socket main body as being capable of being opened and closed and configured to press an electrical component arranged in the socket main body by being closed;
an opening/closing link mechanism connected to the opening/closing body with a base end part thereof connected to the socket main body and the operating member to close the opening/closing body when being lifted by the operating member; and
a depression mechanism which depresses a leading end part of the opening/closing link mechanism when the opening/closing body is closed,
wherein the depression mechanism includes a depression member which opens the opening/closing link mechanism when the opening/closing body is opened and which is engaged with and depresses the leading end part of the opening/closing link mechanism when the opening/closing body is closed.

2. The socket for an electrical component according to claim 1,
wherein the depression mechanism includes a swing lever which is supported by the socket main body in a swingable manner, connected to the operating member at a base end part of the swing lever, and engaged with the depression member at a leading end part of the swing lever, and the leading end part of the swing lever depresses the depression member when the operating member is lifted.

* * * * *